(12) United States Patent
Kang et al.

(10) Patent No.: US 10,529,797 B2
(45) Date of Patent: Jan. 7, 2020

(54) SEMICONDUCTOR DEVICE HAVING A DEEP-TRENCH CAPACITOR INCLUDING VOID AND FABRICATING METHOD THEREOF

(71) Applicant: MagnaChip Semiconductor, Ltd., Cheongju-si (KR)

(72) Inventors: Yang Beom Kang, Cheongju-si (KR); Kang Sup Shin, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 16/001,075

(22) Filed: Jun. 6, 2018

(65) Prior Publication Data
US 2019/0181217 A1 Jun. 13, 2019

(30) Foreign Application Priority Data
Dec. 11, 2017 (KR) .................. 10-2017-0169713

(51) Int. Cl.
*H01L 27/32* (2006.01)
*H01L 27/108* (2006.01)
*H01L 49/02* (2006.01)
*H01L 23/00* (2006.01)

(52) U.S. Cl.
CPC ............ *H01L 28/82* (2013.01); *H01L 23/562* (2013.01); *H01L 27/10829* (2013.01); *H01L 27/10861* (2013.01); *H01L 27/3265* (2013.01)

(58) Field of Classification Search
CPC ... H01L 28/82; H01L 23/562; H01L 27/3265; H01L 2924/1205; H01L 2210/025; H01L 27/10829; H01L 27/10861; H01L 28/00; H01L 28/40
See application file for complete search history.

(56) References Cited

U.S. PATENT DOCUMENTS

| 5,410,509 | A | * | 4/1995 | Morita | .................. | G11C 11/404 |
| | | | | | | 257/E27.085 |
| 9,178,080 | B2 | | 11/2015 | Kalnitsky et al. | | |
| 9,978,829 | B2 | | 5/2018 | Lin | | |
| 2012/0193785 | A1 | * | 8/2012 | Lin | ................... | H01L 21/76229 |
| | | | | | | 257/737 |
| 2013/0161792 | A1 | * | 6/2013 | Tran | ....................... | H01L 29/92 |
| | | | | | | 257/534 |
| 2013/0271938 | A1 | * | 10/2013 | Lindert | .................. | H05K 1/182 |
| | | | | | | 361/782 |
| 2014/0145299 | A1 | * | 5/2014 | Kalnitsky | ............. | H01L 29/945 |
| | | | | | | 257/532 |
| 2014/0291767 | A1 | * | 10/2014 | Lee | ................... | H01L 21/76229 |
| | | | | | | 257/368 |

(Continued)

*Primary Examiner* — Galina G Yushina
(74) *Attorney, Agent, or Firm* — NSIP Law

(57) ABSTRACT

A semiconductor device includes a semiconductor region, deep trenches, a dielectric film, a conductive material, an interlayer insulating film, and a metal interconnection. The semiconductor region has a first conductivity type in a silicon substrate. The deep trenches are disposed in the semiconductor region. The dielectric film is disposed on sidewalls of the deep trenches. The conductive material is disposed on the dielectric film. The interlayer insulating film is disposed on upper surface portions of the deep trenches to create a void inside each of the deep trenches. The metal interconnection is disposed on the interlayer insulating film.

22 Claims, 9 Drawing Sheets

(56) References Cited

U.S. PATENT DOCUMENTS

2015/0214293 A1* 7/2015 Liao ................. H01L 28/75
                                                                             257/532
2017/0186837 A1  6/2017 Yen et al.
2017/0194418 A1* 7/2017 Papavasiliou ........... H01L 28/60
2017/0250029 A1* 8/2017 Yamamoto ............... H01G 4/40

* cited by examiner

FIG. 4
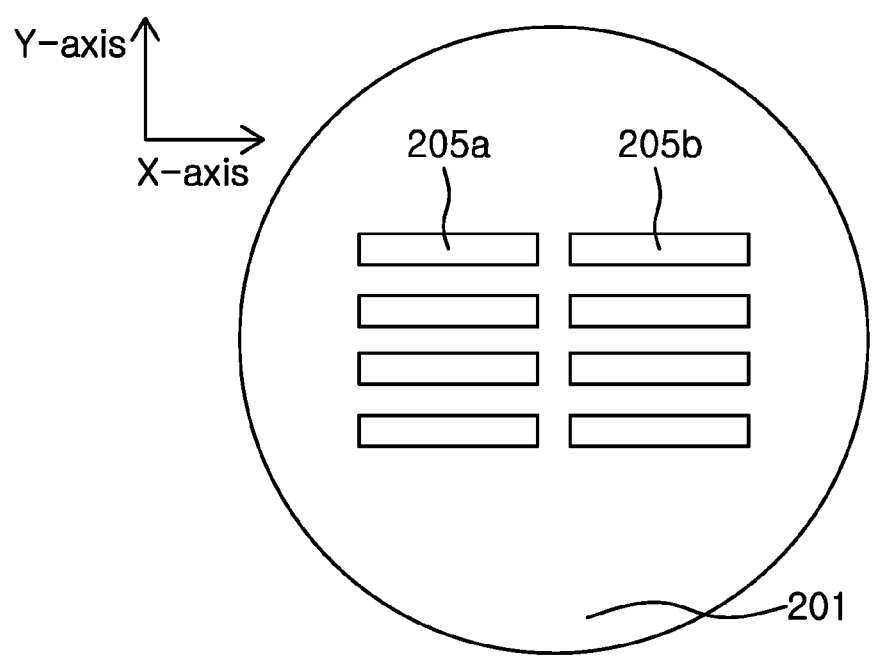

SEMICONDUCTOR DEVICE HAVING A DEEP-TRENCH CAPACITOR INCLUDING VOID AND FABRICATING METHOD THEREOF

CROSS-REFERENCE TO RELATED APPLICATIONS

This application claims the benefit under 35 USC 119(a) of Korean Patent Application No. 10-2017-0169713 filed on Dec. 11, 2017 in the Korean Intellectual Property Office, the entire disclosure of which is incorporated herein by reference for all purposes.

BACKGROUND

1. Field

The present disclosure relates to a semiconductor device having a deep-trench capacitor including a void and a manufacturing method thereof, and in particular to, a semiconductor device having a trench capacitor that minimizes the phenomenon of a bent wafer.

2. Description of Related Art

Semiconductor manufacturing techniques have been developed to steadily reduce the size of devices in order to form more devices in a same area. This kind of technique is divided into a method of implementing devices on a semiconductor substrate and a method of fabricating the implementation of devices in a semiconductor substrate.

In particular, a method of implementing devices in a vertical direction in a substrate reduces the area of a semiconductor used, which is desired in various fields. A trench metal oxide semiconductor field effect transistor (MOSFET) or a trench capacitor that forms a trench in a silicon substrate are examples of devices vertically built.

In devices that includes a trench, in order to maximize a surface area of the device, the width of the trench is reduced, and the density and depth of the trench are increased. In this case, with such a configuration, the internal stress of the wafer is increased, thereby increasing the occurrence of a wafer bending phenomenon.

The wafer bending phenomenon causes considerable difficulty in wafer fabrication. In particular, it causes errors during a manufacturing process of fixing a wafer on a stage, such as photolithography and etching processes. As described above, in the case of manufacturing a device that includes a trench, improving the degree of integration of devices is limited by the bending of the wafer.

One of the prior arts discloses a method of manufacturing a device by forming trenches in a substrate. An insulating film and electrode materials are then formed on the trench surface. However, as disclosed by the prior art, the bending phenomenon in a wafer due to the stress increase inside the wafer still exists.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a semiconductor region, deep trenches, a dielectric film, a conductive material, an interlayer insulating film, and a metal interconnection. The semiconductor region has a first conductivity type in a silicon substrate. The deep trenches are disposed in the semiconductor region. The dielectric film is disposed on exposed surfaces of the deep trenches and the semiconductor region. The conductive material is disposed on the dielectric film. The interlayer insulating film is disposed on upper surface portions of the deep trenches to create a void inside each of the deep trenches. The metal interconnection is disposed on the interlayer insulating film.

The semiconductor device may further include a bottom oxide film disposed on a back side of the silicon substrate; and a bottom nitride film disposed on the bottom oxide film.

The semiconductor device may further include a top oxide film disposed on the metal interconnection; and a top nitride film disposed on the top oxide film.

The semiconductor region may be used as a lower electrode, and the conductive material may be used as an upper electrode.

The semiconductor device may further include a field oxide in the silicon substrate, wherein the conductive material may extend to the field oxide.

The conductive material may abut the metal interconnection on the field oxide.

The interlayer insulating film may penetrate into the deep trenches.

The semiconductor device may further include a contact plug in the interlayer insulating film, wherein the metal interconnection may connect the conductive material through the contact plug.

The deep trenches may include first trenches arranged in a first direction; and second trenches arranged in a second direction that is perpendicular to the first direction.

The first trenches may include a first-group trench; and a second-group trench, wherein the first-group trench is arranged diagonally to the second-group trench. The second trenches may include a third-group trench; and a fourth-group trench, and wherein the third-group trench is arranged diagonally to the fourth-group trench.

In another general aspect, a method of manufacturing a semiconductor device having a deep-trench capacitor includes forming a doped semiconductor region having a first conductivity type in a silicon substrate; forming deep trenches in the doped semiconductor region; forming a dielectric film on exposed surfaces of the deep trenches; and the semiconductor region; forming a conductive material on the dielectric; film; forming an interlayer insulating film on the conductive material to create a void inside at least one of the deep trenches; and forming a metal interconnection on the interlayer insulating film.

The method may further include forming a bottom oxide film on a back side of the silicon substrate; forming a bottom nitride film on the bottom oxide film; forming a top oxide film on the metal interconnection; and forming a top nitride film on the top oxide film.

The interlayer insulating film may partially penetrate into the deep trenches.

In another general aspect, a semiconductor device includes a semiconductor region, deep trenches, a dielectric film, a conductive material, an interlayer insulating film, and a metal interconnection. The silicon substrate has a semiconductor region. The deep trenches is disposed in the semiconductor region. The dielectric film is disposed on contours of the deep trenches. The conductive material is disposed on the dielectric film. The interlayer insulating film is disposed on upper surface portions of the deep trenches to create a void inside each of the deep trenches. The metal interconnection is disposed on the interlayer insulating film.

The conductive material may be connected to the metal interconnection.

Contact plugs may be formed in the interlayer insulating film to connect the conductive material and the metal interconnection.

The semiconductor device may further include a field oxide in the silicon substrate, wherein the conductive material extends over a portion of the field oxide.

The interlayer insulating film may penetrate a portion of each of the deep trenches.

The conductive material may connect to the metal interconnection on the field oxide.

Other features and aspects will be apparent from the following detailed description, the drawings, and the claims.

BRIEF DESCRIPTION OF THE DRAWINGS

FIGS. 4 and 5 illustrate a wafer bent in a trench arrangement direction.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
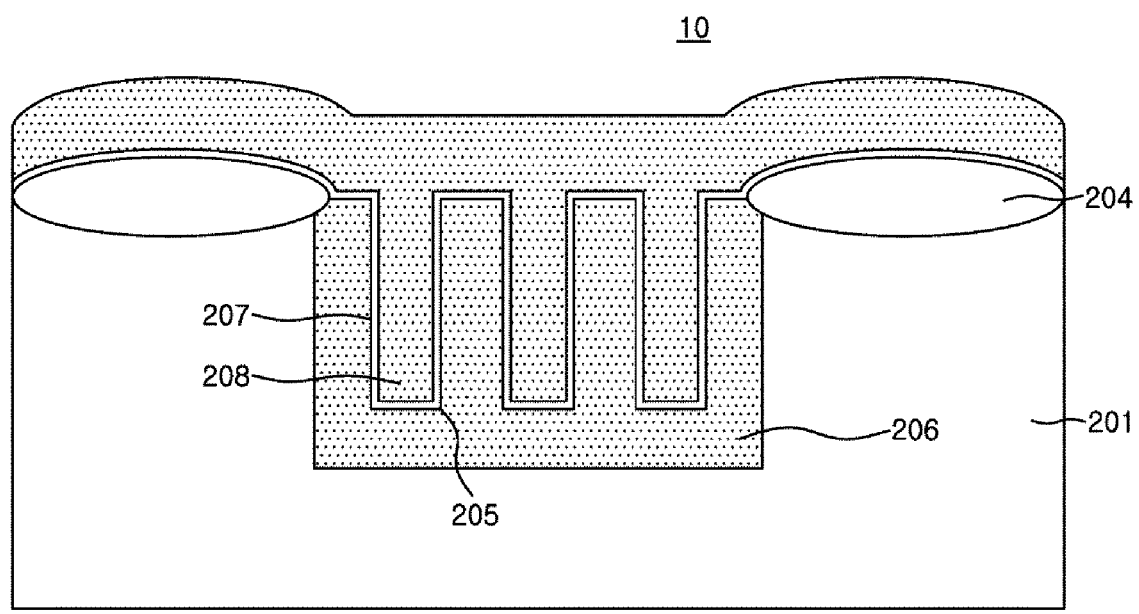
FIG. 1 is a cross-sectional view of a general form of a semiconductor device having a deep trench capacitor formed using a deep trench according to an embodiment of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The features of the examples described herein may be combined in various ways as will be apparent after an understanding of the disclosure of this application. Further, although the examples described herein have a variety of configurations, other configurations are possible as will be apparent after an understanding of the disclosure of this application.

The present disclosure relates to forming a trench in a silicon substrate and manufacturing a device using the trench. The term "deep trench" as used distinguishes from a shallow trench (ST) used for device separation in general complementary metal oxide semiconductor (CMOS).

The bending of wafers is a phenomenon that may occur as stresses in one direction, that is, compressive stress and/or tensile stress, are continuously accumulated. In the present disclosure, the bending phenomenon in wafers are alleviated in a manner of forming, on a back side of the wafer, a film for generating stress in the same direction as a stress applied to the wafer and forming, on a top surface of the wafer, a film for generating stress in the opposite direction.

In addition, in the case of a method of completely filling the deep trench with respect to the deep trench structure, stress is increased due to a difference in thermal expansion coefficient between a silicon substrate and the films filling the deep trench. As such, an empty space is formed in the deep trench to minimize the increase of the internal stress.

In addition, in order to alleviate the increase of tensile stress generated during the metal wiring process of subsequent processes, the bending of the wafer is controlled by depositing an oxide film serving as a buffer on the metal interconnection and a nitride film generating a high compressive stress on the metal interconnection.

The present disclosure is provided to suggest a semiconductor device having a deep-trench capacitor including a void and a manufacturing method thereof that alleviate tensile stress applied to a wafer.

FIG. 1 is a cross-sectional view of a general form of a semiconductor device having a deep trench capacitor formed using a deep trench according to an embodiment of the present disclosure. In detail, FIG. 1 illustrates a general form of a MOSFET or a capacitor formed using a deep trench.

Referring to FIG. 1, a semiconductor device having a deep trench capacitor 10 may include a silicon substrate 201, a field oxide 204, deep trenches 205, a lower electrode 206, a dielectric film 207, and an upper electrode 208.

According to an embodiment, the deep trenches 205 are formed at a depth of about 5 μm to 30 μm in the N-type silicon substrate 201. The dielectric film 207 with an even depth is formed on the sidewall and surface contours of the deep trenches 205. If the deep trench device 10 is a deep trench MOSFET, the dielectric film 207 is made of an oxide film produced by an oxidation reaction of silicon. If the deep trench device 10 is a semiconductor device having a deep-trench capacitor, the dielectric film 207 adopts a structure where an oxide film and a nitride film are laminated.

An example where the deep trench device 10 is a semiconductor device having a deep-trench capacitor is described in the below.

After forming the dielectric film 207, a conductive material 208 is deposited on the dielectric film 207. The conductive material 208 may be an N-type doped polysilicon. The doped polysilicon film is a conductor serving as an upper electrode 208 disposed in the deep trenches 205.

However, the difference between a coefficient of thermal expansion of the silicon substrate 201 and a coefficient of thermal expansion of the deep trenches 205 formed inside the silicon substrate 201 brings about tensile stress to the silicon substrate 201, and thus, a wafer bending phenomenon may occur resulting in the silicon substrate 201 being bent downward.

Figure 2:
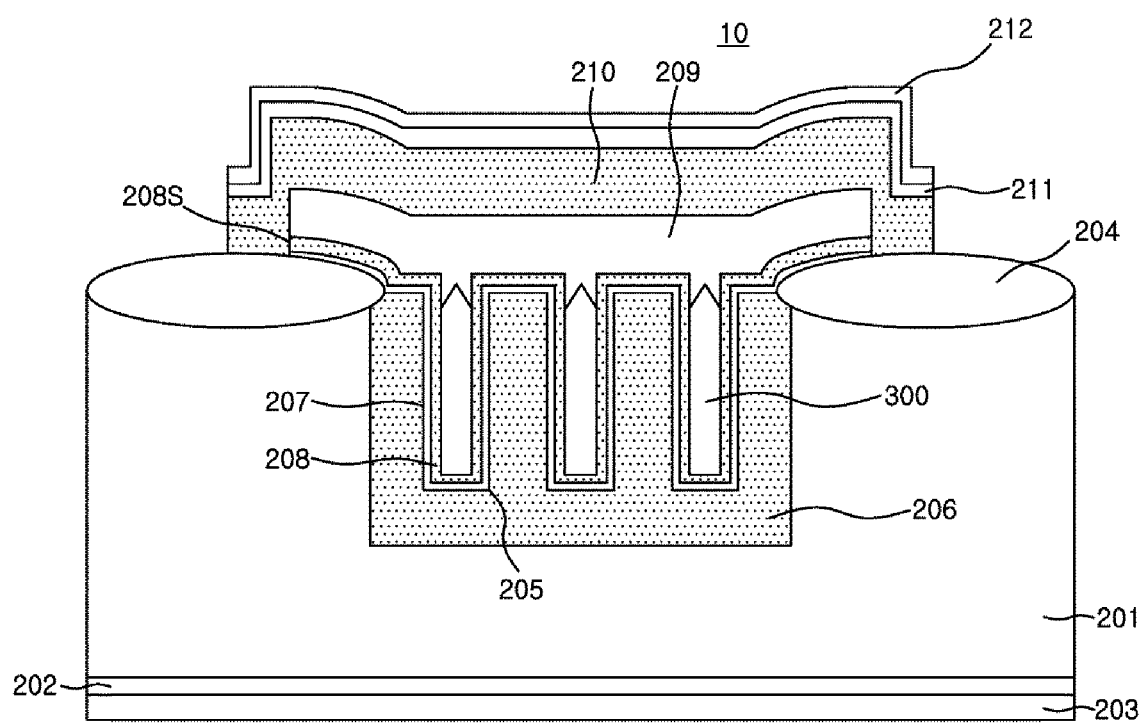
FIG. 2 is a cross-sectional view of an embodiment of a semiconductor device having a deep-trench capacitor.

A method for solving a wafer bending phenomenon is described in detail in accordance with a process order, with reference to FIG. 2.

FIG. 2 is a cross-sectional view of an embodiment of a semiconductor device having a deep-trench capacitor for solving a phenomenon that results in the bending of a wafer. Referring to FIG. 2, a highly doped semiconductor region 206 with a first conductivity type is formed in a silicon substrate 201. Deep trenches 205 are formed in the semiconductor region 206. A dielectric film 207 is formed on exposed surfaces of the deep trenches 205 and the semiconductor region. A conductive material (polysilicon) 208 is formed on the dielectric film 207. An interlayer insulating film 209 is formed on the conductive material 208. The interlayer insulating film 209 partially penetrates into the deep trenches 205. A metal interconnection 210 is formed on the interlayer insulating film 209.

The semiconductor region 206 with first conductivity type, formed in the silicon substrate 201, has a conductivity type different from the conductivity type of the silicon substrate 201 and is highly doped. For example, if the conductivity type of the semiconductor region 206 is an N-type, the conductivity type of the silicon substrate 201 is of a P-type, and vice-versa. According to embodiments, the highly doped semiconductor region 206 below the field oxide 204 serves as a lower electrode.

A bottom oxide film 202 is formed on a back side of the silicon substrate 201. A bottom nitride film 203 is formed on the bottom oxide film 202. A top oxide film 211 is formed on the metal interconnection 210. A top nitride film 212 is formed on the top oxide film 211. The semiconductor region 206 having a first conductivity type is used as a lower electrode, and the conductive material 208 is used as an upper electrode. A field oxide is further formed on the semiconductor region 206. The conductive material 208 is formed to extend to the field oxide, and a sidewall 208S of the conductive material 208 is in contact with the metal interconnection 210 on the field oxide. Each of the deep trenches 205 includes a void or air gap 300. In another embodiment, at least one of the deep trenches may contain a void or air gap. The interlayer insulating film 209 formed on the deep trenches 205 fills an upper portion of the deep trenches 205.

Figure 3:
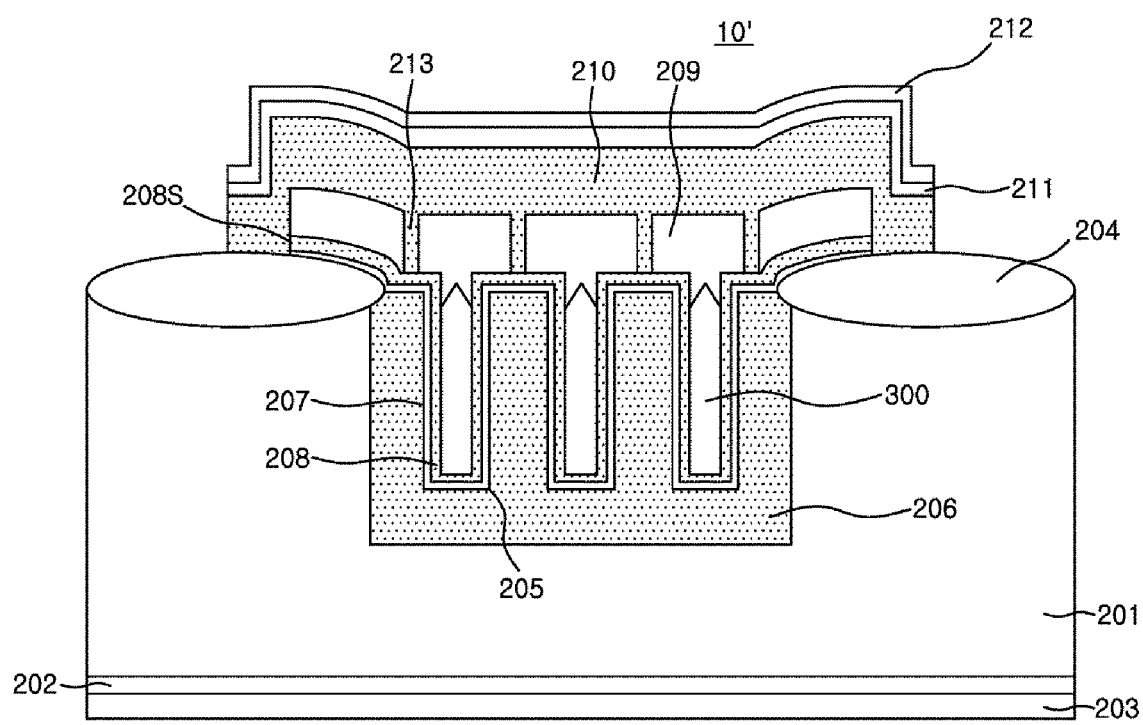
FIG. 3 is a cross-sectional view of another embodiment of semiconductor device having a deep trench capacitor.

FIG. 3 is a cross-sectional view of another embodiment of semiconductor device having a deep trench capacitor for solving a phenomenon that results in the bending of a wafer. FIG. 3 has a structure similar to the structure of FIG. 2, but FIG. 3 further includes a contact plug 213 formed in an interlayer insulating film 209. The contact plug 213 is in contact with a metal interconnection 210 and a conductive material 208. A structure in which the metal interconnection 210 is electrically connected to the sidewall (208S) of the upper electrode 208, as illustrated in FIG. 2, increases resistance. Therefore, if the contact plug 213, exposing a portion of the upper electrode 208, is formed by selectively etching the interlayer insulating film 209, the length of a current path between the metal interconnection 210 and the upper electrode 208 is reduced. Accordingly, the resistance of semiconductor device having a deep trench capacitor 10' may be reduced.

Figure 5:
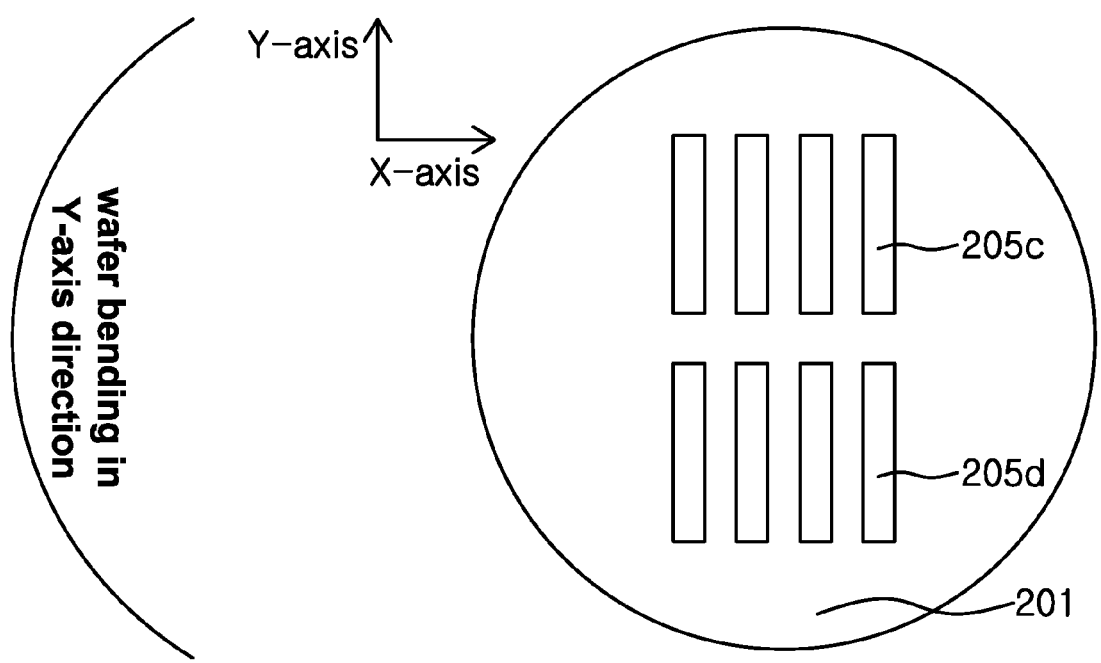
Figure 6:
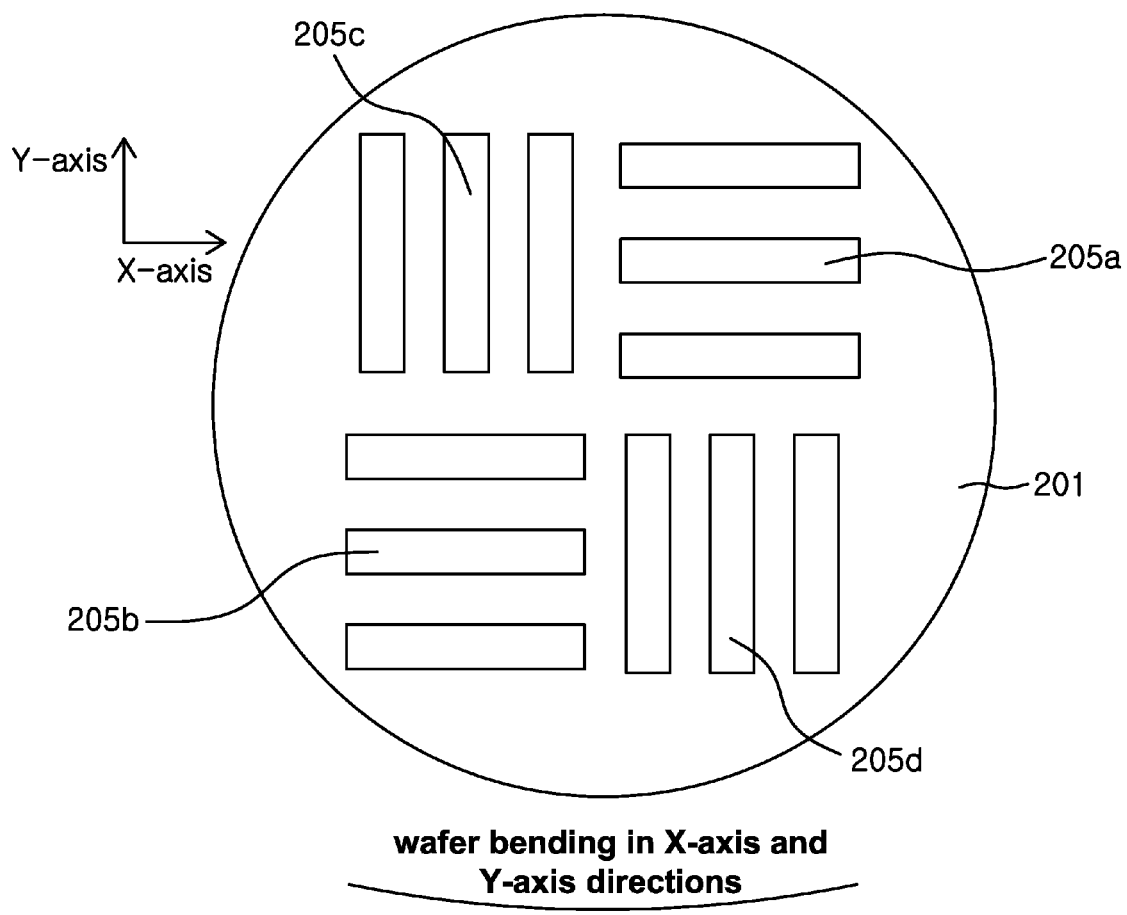
FIG. 6 illustrates an embodiment of a semiconductor device having a deep-trench capacitor.

FIG. 4 and FIG. 5 illustrate a wafer bent in a trench arrangement direction, and FIG. 6 illustrates an embodiment of a semiconductor device having a deep-trench capacitor for solving a phenomenon that results in the bending of a wafer.

The wafer bending phenomenon is related to not only a depth of a trench but also a direction of the trench. As illustrated in FIGS. 4 and 5, in the case of a trench capacitor in related arts, trenches 205a, 205b, 205c, 205d are typically formed as a bar type.

First, as illustrated in FIG. 4, deep trenches 205a, 205b are arranged in an X-axis direction of a wafer 201. In this case, the bending of the wafer 201 becomes more severe in the X-axis direction because stress occurs along the singular orientation of the deep trenches in the wafer 201

In addition, as illustrated in FIG. 5, deep trenches 205c, 205d are arranged in a Y-axis direction of a wafer 201. In this case, the bending of the wafer 201 becomes more severe in the Y-axis direction because stress occurs along the singular orientation of the deep trenches in the wafer 201.

As illustrated in FIG. 6, deep trenches 205a, 205b, 205c, 205d are arranged in a mixed manner of X-axis and Y-axis directions. Some deep trenches 205a, 205b are arranged in X-axis direction, and the other deep trenches 205c, 205d are arranged in Y-axis direction. In this configuration, the bending of the wafer due to stress in a singular direction may be alleviated by dispersing the stress applied to the wafer 201 multiple directions.

Deep trenches 205a, 205b, 205c, 205d include first trenches 205a, 205b formed in a first direction and second trenches 205c, 205d formed in a second direction that is perpendicular to the first direction. The first trenches 205a, 205b include first group trench 205a and a second group trench 205b. The first group trench 205a and the second group trench 205b are arranged diagonally to each other. In a similar way, the second trenches include a third group trench 205c and fourth group trench 205d. The third group trench 205c and the fourth group trench 205d are arranged diagonally to each other. The diagonal arrangement of the trenches may disperse the unidirectional stress typically present in wafers, thereby, alleviating the bending of the wafer.

Figure 7:
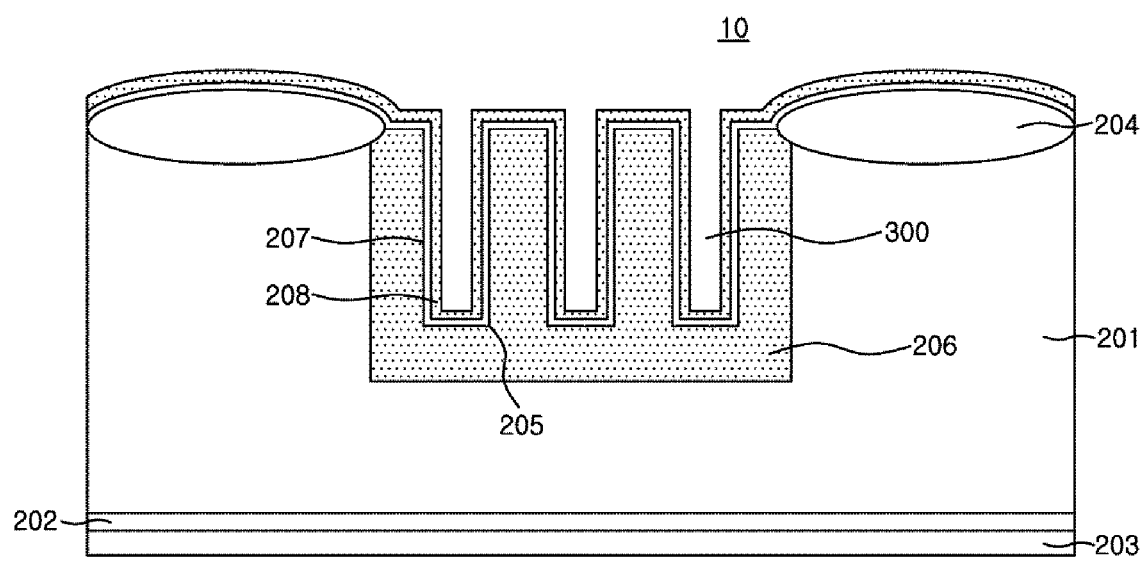
FIGS. 7 to 9 illustrate an embodiment of a method of manufacturing a semiconductor device having a deep-trench capacitor.
Figure 8:
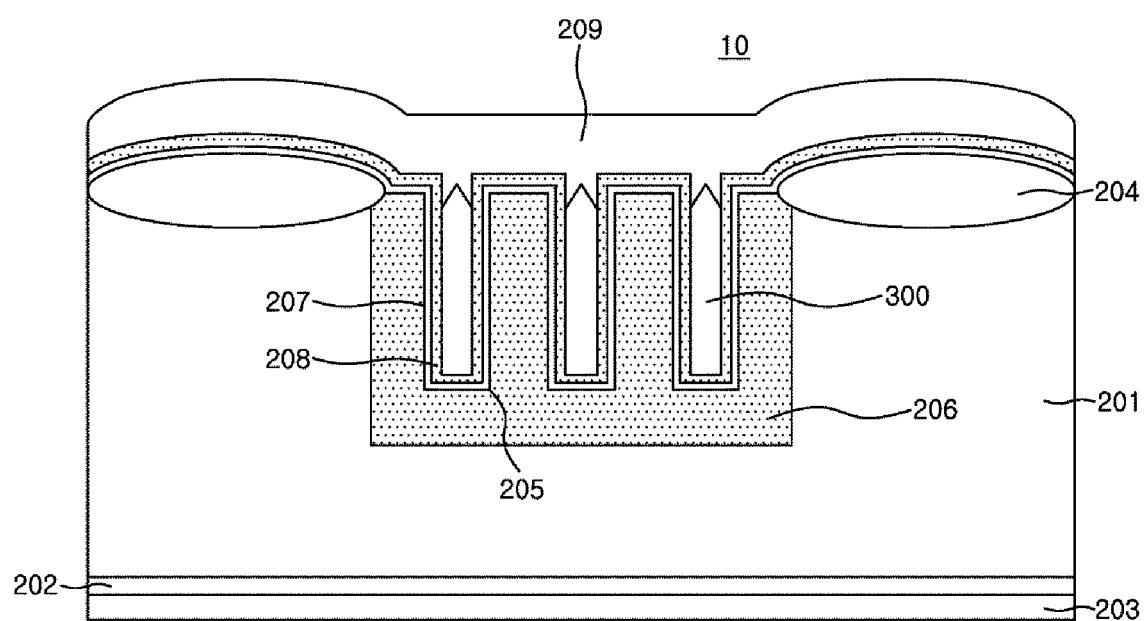
Figure 9:
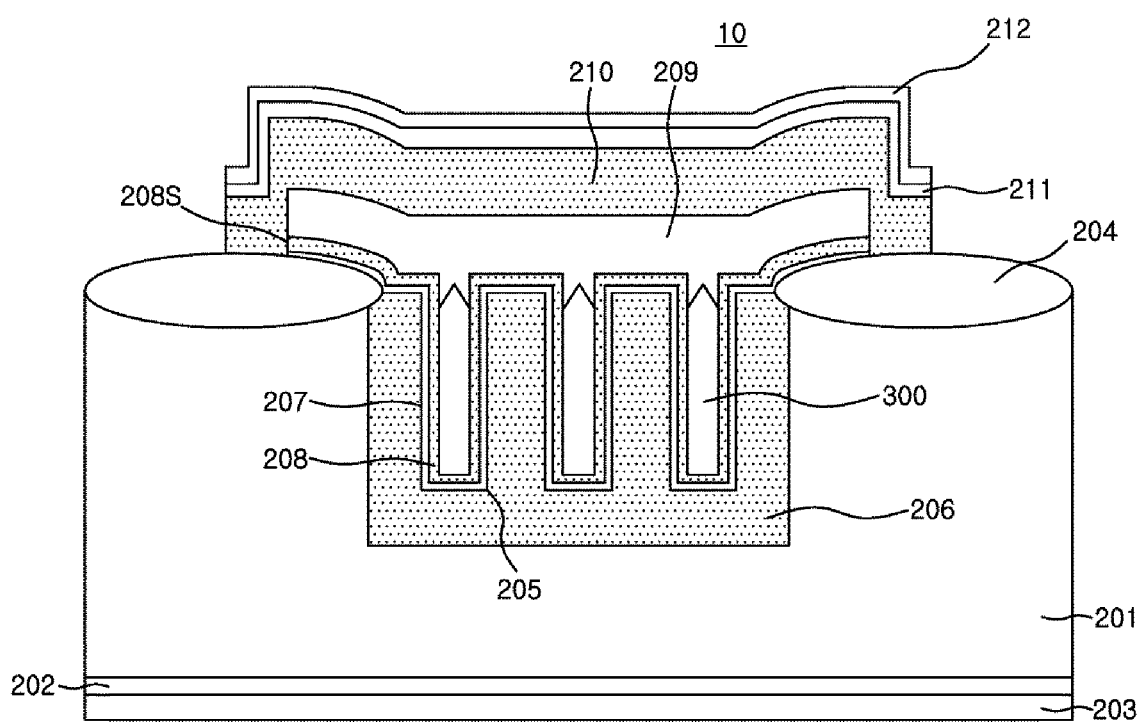

FIGS. 7 to 9 illustrate an embodiment of a method of manufacturing semiconductor device having a deep trench capacitor to solve a wafer being bent.

First, referring to FIG. 7, a bottom oxide film 202 is formed on the back side of a silicon substrate 201, and then, a bottom nitride film 203 is deposited on the bottom oxide film 202 using chemical vapor deposition (CVD) process. So stacked layers comprising the bottom oxide film 202 and the bottom nitride film 203 are formed on the back side of the silicon substrate 201. Stacked layers comprising oxide/nitride films are also formed on the front surface of the silicon substrate 201. However, the stacked layers deposited on the front surface of the silicon substrate 201 may be selectively removed using a dry etching process after forming the field oxide 204 as explained below.

The bottom oxide film 202 serves to alleviate stress between the bottom nitride film 203 and the silicon substrate 201 and prevents damage to the silicon substrate 201.

Since the silicon substrate 201 including deep trenches 205 is subject to tensile stress, a nitride film under tensile stress in the same direction may be maintained under a back side of the silicon substrate 201 in order to alleviate the tensile stress of the silicon substrate 201.

After depositing the bottom oxide film 202 and bottom nitride film 203, a field oxide 204 is formed by Local Oxidation of Silicon (LOCOS) or shallow trench isolation (STI) processes.

After the field oxide 204 is formed, a nitride film on the top surface of the silicon substrate 201 is removed by dry etching, and the nitride film on the back side of the silicon substrate 201 remains. In general, once the field oxide is formed, the nitride film is removed by a wet etching process using phosphoric acid (H3PO4), but in embodiments of the present disclosure, dry etching is performed without a wet etching process using phosphoric acid.

The bottom nitride film 203 on the back side of the silicon substrate 201 plays a role in ameliorating stress generated by the deep trenches 205 formed in the silicon substrate 201. Hence, there is an effect that the tensile stress of the silicon substrate 201 is ameliorated.

After forming the field oxide, deep trenches having a depth of about 5 μm to 30 μm are formed in the silicon substrate 201. A CVD dielectric film 207 is deposited on exposed surfaces of the deep trenches 205 and the semiconductor region. The dielectric film 207 may be formed by either one of an oxide film or a nitride film.

Further, a conductive material 208 is deposited on the dielectric film 207 using low-pressure CVD (LPCVD) in order to mitigate the wafer bending phenomenon. For example, the upper electrode 208 may be doped polysilicon.

The doped conductive material 208 may leave a certain area by reducing the thickness of the conductive material 208 without filling the deep trenches 205 during a deposition process, which means obtaining a space for releasing the stress generated due to the difference between a coefficient of thermal expansion of the silicon substrate 201 and a coefficient of thermal expansion of the deep trenches 205. For example, the conductive material 208 may have a thickness of 1000 Å to 5000 Å.

In addition, if the thickness of doped conductive material 208 is reduced, the increase in tensile stress of the silicon substrate 201 is mitigated; therefore, a additional improvement is obtained. However, an upper portion of the deep trenches 205 may be blocked in order to prevent the photoresist (PR) from entering an empty space of the deep trenches 205 when proceeding with a subsequent photolithography process or like.

FIG. 8 illustrates a method of manufacturing a semiconductor device having a deep-trench capacitor to solve a phenomenon that results in the bending of a wafer. Referring to FIG. 8, an interlayer insulating film 209 is formed on the upper portion of deep trenches 205 to create a void 300 or an air gap 300 inside each of the deep trenches 205.

The interlayer insulating film 209 may be a plasma enhanced-tetraethyl orthosilicate (PE-TEOS) film having a low step coverage. The step coverage refers to an even thickness of a deposited film, and means that deposition characteristics on a sidewall is lower than the deposition characteristics on a top surface when there is a stepped step on the wafer surface.

Therefore, it is possible to prevent impurities such as PR from entering the empty space in the deep trenches 205 while maintaining the empty space inside the deep trenches 205 by using the PE-TEOS having low step coverage.

FIG. 9 illustrates an embodiment of a method of manufacturing a semiconductor device having a deep-trench capacitor to solve a phenomenon that results in the bending of a wafer. Referring to FIG. 9, a metal interconnection 210 connected to an upper electrode 208 is formed in a semiconductor device having a deep trench capacitor 10.

In the case of a device using a deep trench, a thick metal interconnection of about 2 μm to about 4 μm is applied to reduce resistance and to ensure bonding stability. In general, metal, such as aluminum, generates tensile stress and aggravates the wafer bending phenomenon.

In order to alleviate or control such a tensile stress, additional insulating films having a high compressive stress are required, for example, a compressive oxide film and compressive nitride film. A compressive top oxide film 211 is deposited on the metal interconnection 210 having a thickness of about 100 Å to about 500 Å. After that, a compressive top nitride film 212 is deposited having a thickness of 500 Å~3000 Å. A compressive top oxide film 211 also serves as a buffer layer between a metal interconnection 210 and a top nitride film 212.

As described above, a semiconductor device having a deep-trench capacitor including a void and a fabricating method thereof may alleviate tensile stress applied to a wafer, thereby reducing the bending phenomenon that results as a result of stress in the wafer While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
   a semiconductor region having a first conductivity type in a silicon substrate having a second conductivity type;
   deep trenches disposed in the semiconductor region;
   a dielectric film disposed on exposed surfaces of the deep trenches and the semiconductor region;
   a conductive material disposed on the dielectric film;
   an interlayer insulating film disposed on upper surface portions of the deep trenches to create a void inside each of the deep trenches; and
   a metal interconnection disposed on the interlayer insulating film and abutting a sidewall of the conductive material.

2. The semiconductor device of claim 1, further comprising:
   a bottom oxide film disposed on a back side of the silicon substrate; and
   a bottom nitride film disposed on the bottom oxide film.

3. The semiconductor device of claim 1, further comprising:
   a top oxide film disposed on the metal interconnection; and
   a top nitride film disposed on the top oxide film.

4. The semiconductor device of claim 1, wherein the semiconductor region is doped with dopant ions of the first conductivity type and is used as a lower electrode, and the conductive material is used as an upper electrode.

5. The semiconductor device of claim 1, further comprising a field oxide in the silicon substrate, wherein the conductive material extends to the field oxide.

6. The semiconductor device of claim 5, wherein each of the sidewalls of the conductive material abuts the metal interconnection on the field oxide.

7. The semiconductor device of claim 1, wherein the interlayer insulating film penetrates into the deep trenches.

8. The semiconductor device of claim 1, further comprising a contact plug in the interlayer insulating film, wherein the metal interconnection is connected to the conductive material through the contact plug.

9. The semiconductor device of claim 1, wherein the deep trenches comprise:
   first trenches arranged in a first direction; and
   second trenches arranged in a second direction that is perpendicular to the first direction.

10. The semiconductor device of claim 9,
    wherein the first trenches comprise:
       a first-group trench; and
       a second-group trench,
    wherein the first-group trench is arranged diagonally to the second-group trench,
    wherein the second trenches comprise:
       a third-group trench; and
       a fourth-group trench, and
    wherein the third-group trench is arranged diagonally to the fourth-group trench.

11. The semiconductor device of claim 1, wherein the void is disposed in the semiconductor region.

12. The semiconductor device of claim 3, wherein the top oxide film and the top nitride film disposed on the metal interconnection are arranged to be aligned with the metal interconnection.

13. The semiconductor device of claim 1, wherein the metal interconnection abuts a sidewall of the interlayer insulating film.

14. A method of manufacturing a semiconductor device having a deep-trench capacitor, the method comprising:
    forming a doped semiconductor region having a first conductivity type in a silicon substrate having a second conductivity type;
    forming deep trenches in the doped semiconductor region;
    forming a dielectric film on exposed surfaces of the deep trenches and the semiconductor region;
    forming a conductive material on the dielectric film;
    forming an interlayer insulating film on the conductive material to create a void inside at least one of the deep trenches; and
    forming a metal interconnection on the interlayer insulating film,
    wherein the metal interconnection abuts a sidewall of the conductive material.

15. The method of claim 14, further comprising:
    forming a bottom oxide film on a back side of the silicon substrate;
    forming a bottom nitride film on the bottom oxide film;
    forming a top oxide film on the metal interconnection; and
    forming a top nitride film on the top oxide film.

16. The method of claim 14, wherein the interlayer insulating film partially penetrates into the deep trenches.

17. A semiconductor device, comprising:
    a silicon substrate having a doped semiconductor region;
    deep trenches disposed in the semiconductor region;
    a dielectric film disposed on exposed contours of the deep trenches and the semiconductor region;
    a conductive material disposed on the dielectric film;
    an interlayer insulating film disposed on upper surface portions of the deep trenches to create a void inside each of the deep trenches; and
    a metal interconnection disposed on the interlayer insulating film and abutting a sidewall of the conductive material.

18. The semiconductor device of claim 17, wherein the conductive material is connected to the metal interconnection.

19. The semiconductor device of claim 18, wherein contact plugs are formed in the interlayer insulating film to connect the conductive material and the metal interconnection.

20. The semiconductor device of claim 18, further comprising a field oxide in the silicon substrate, wherein the conductive material extends over a portion of the field oxide.

21. The semiconductor device of claim 17, wherein the interlayer insulating film penetrates a portion of each of the deep trenches.

22. The semiconductor device of claim 17, wherein the metal interconnection abuts a sidewall of the interlayer insulating film.

* * * * *